United States Patent
Yamamoto et al.

(10) Patent No.: US 7,042,100 B2
(45) Date of Patent: *May 9, 2006

(54) DAMASCENE INTERCONNECTION AND SEMICONDUCTOR DEVICE

(75) Inventors: Koji Yamamoto, Kyoto (JP); Nobuhisa Kumamoto, Kyoto (JP); Muneyuki Matsumoto, Kyoto (JP)

(73) Assignee: Rohm Co., Ltd, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/063,148

(22) Filed: Feb. 22, 2005

(65) Prior Publication Data

US 2005/0156332 A1 Jul. 21, 2005

Related U.S. Application Data

(63) Continuation of application No. 09/600,931, filed as application No. PCT/JP99/00225 on Jan. 22, 1999, now Pat. No. 6,879,049.

(30) Foreign Application Priority Data

Jan. 23, 1998 (JP) .................................. 10-11354

(51) Int. Cl.
*H01L 23/48* (2006.01)
(52) U.S. Cl. ...................... 257/775; 257/781; 257/773; 257/786
(58) Field of Classification Search ................ 257/775, 257/781, 773, 786
See application file for complete search history.

(56) References Cited

U.S. PATENT DOCUMENTS

| | | | |
|---|---|---|---|
| 4,933,305 A * | 6/1990 | Kikkawa | 438/120 |
| 5,124,781 A * | 6/1992 | Tashiro | 257/759 |
| 5,248,903 A | 9/1993 | Heim | 257/748 |
| 5,309,025 A | 5/1994 | Bryant et al. | 257/784 |
| 5,365,112 A * | 11/1994 | Ohshima | 257/784 |
| 5,502,337 A | 3/1996 | Nozaki | 257/773 |
| 5,525,546 A | 6/1996 | Harada et al. | 438/612 |
| 5,602,423 A | 2/1997 | Jain | 257/752 |
| 5,607,718 A | 3/1997 | Sasaki et al. | 427/97 |
| 5,681,423 A | 10/1997 | Sandhu et al. | 438/633 |
| 5,686,762 A | 11/1997 | Langley | 257/775 |
| 5,707,894 A | 1/1998 | Hsiao | 437/209 |
| 5,736,791 A | 4/1998 | Fujiki et al. | 257/781 |
| 5,739,587 A | 4/1998 | Sato | 257/758 |
| 5,773,364 A | 6/1998 | Farkas et al. | 438/692 |
| 5,773,899 A * | 6/1998 | Zambrano | 257/784 |
| 5,851,910 A * | 12/1998 | Hsu et al. | 438/612 |
| 5,854,140 A | 12/1998 | Jaso et al. | 438/740 |
| 5,880,007 A | 3/1999 | Varian et al. | 438/427 |
| 5,919,548 A * | 7/1999 | Barron et al. | 428/138 |

(Continued)

FOREIGN PATENT DOCUMENTS

JP          63161634          7/1988

(Continued)

*Primary Examiner*—Eugene Lee
(74) *Attorney, Agent, or Firm*—Gerald T. Bodner (57) ABSTRACT

A semiconductor device includes an insulating film. On this insulating film are formed an interconnection trench communicating with a semiconductor element and a pad trench communicating with the interconnection trench. In the pad trench, a protrusion is formed by leaving one part of the insulating film. A conductive film is formed over the insulating film including the interconnection and pad trenches. Thereafter, the conductive film is removed by a CMP process. At this time, the protrusion serves to prevent the conductive film in the pad trench from being over-polished.

18 Claims, 6 Drawing Sheets

U.S. PATENT DOCUMENTS

| | | | |
|---|---|---|---|
| 5,923,088 A | 7/1999 | Shiue et al. | 257/758 |
| 5,989,991 A * | 11/1999 | Lien | 438/612 |
| 6,033,984 A * | 3/2000 | Schnabel et al. | 438/638 |
| 6,045,435 A | 4/2000 | Bajaj et al. | 451/41 |
| 6,071,810 A * | 6/2000 | Wada et al. | 438/635 |
| 6,100,589 A | 8/2000 | Tanaka | 257/758 |
| 6,103,625 A | 8/2000 | Marcyk et al. | 438/691 |
| 6,133,625 A * | 10/2000 | Maeda | 257/678 |
| 6,143,396 A | 11/2000 | Saran et al. | 428/162 |
| 6,156,660 A | 12/2000 | Liu et al. | 438/692 |
| 6,184,141 B1 | 2/2001 | Avanzino et al. | 438/692 |
| 6,198,170 B1 | 3/2001 | Zhao | 257/784 |
| 6,204,149 B1 | 3/2001 | Batra et al. | 438/435 |
| 6,306,750 B1 * | 10/2001 | Huang et al. | 438/612 |
| 6,362,528 B1 | 3/2002 | Anand | 257/758 |
| 6,577,017 B1 | 6/2003 | Wong | 257/786 |
| 6,879,049 B1 * | 4/2005 | Yamamoto et al. | 257/786 |

FOREIGN PATENT DOCUMENTS

| | | |
|---|---|---|
| JP | 05343466 | 12/1993 |
| JP | 06318590 | 11/1994 |
| JP | 9148329 | 6/1997 |
| JP | 10064968 | 3/1998 |
| JP | 10229085 | 8/1998 |
| JP | 200208443 | 7/2000 |

* cited by examiner

DAMASCENE INTERCONNECTION AND SEMICONDUCTOR DEVICE

CROSS REFERENCE TO RELATED APPLICATION

This application is a continuation of patent application Ser. No. 09/600,931, filed on Jul. 21, 2000, U.S. Pat. No. 6,879,049, which is a 371 of PCT/JP99/00225, filed Jan. 1, 1999 and entitled "Damascene Interconnection and Semiconductor Device", the disclosure of which is incorporated herein by reference. Priority under 35 U.S.C. 120 based on the aforementioned application is hereby claimed.

TECHNICAL FIELD

This invention relates to damascene interconnections and semiconductor devices. More particularly, the invention relates to a damascene interconnection having a bonding pad formed by a pad trench and a metal or conductive film filling the pad trench, and to a semiconductor device using same.

PRIOR ART

Recently, a so-called damascene process has been adopted to provide multilevel interconnections for a semiconductor device having a metal or conductive film buried in the insulating film.

Figure 1:
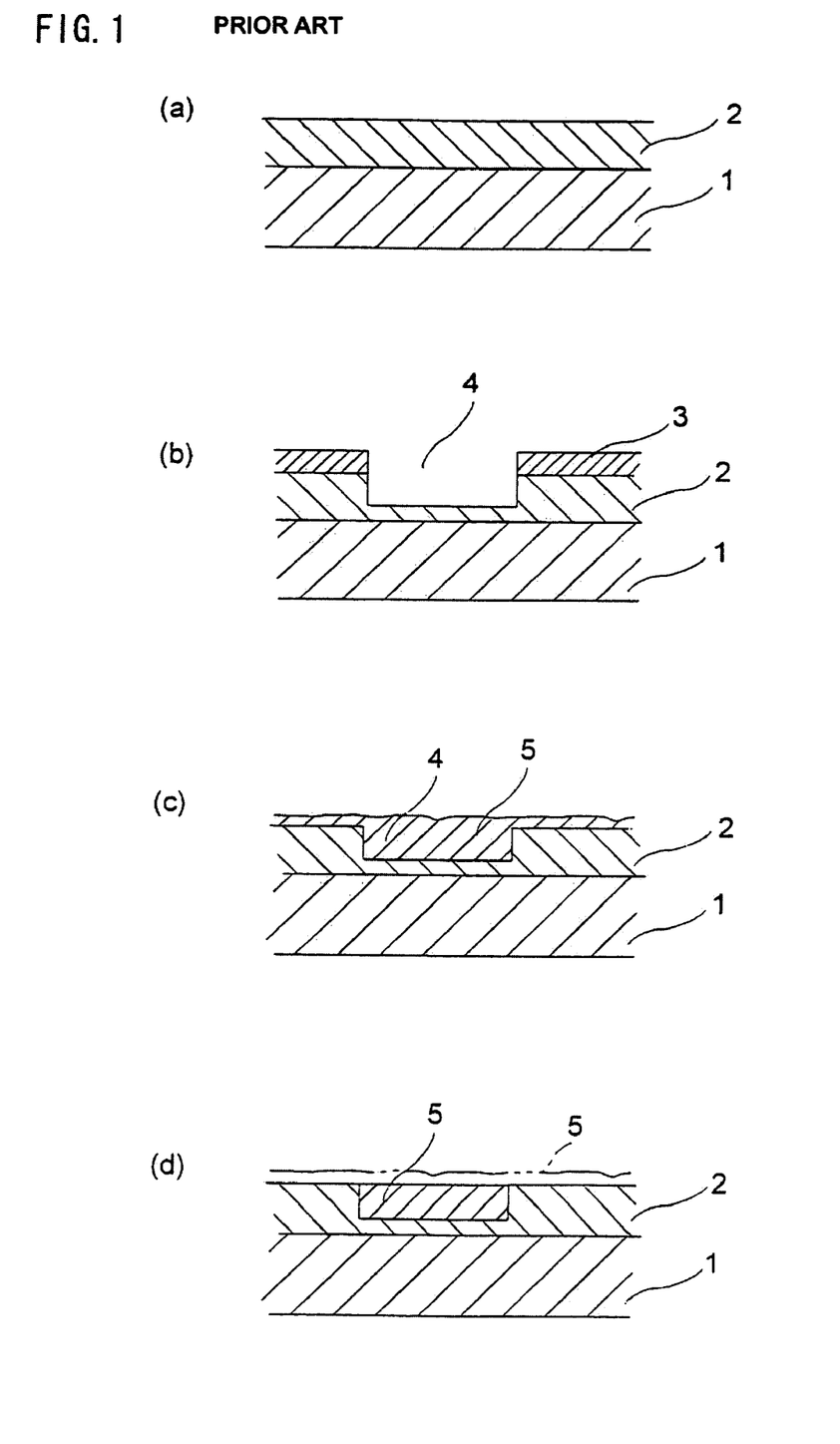
FIG. 1 is an illustrative view showing a process for a general damascene interconnection.

Briefly explaining a general damascene interconnection, an insulating film 2 formed on a semiconductor substrate 1 as shown in FIG. 1(*a*) is etched using a mask of resist 3 patterned corresponding to an interconnection, as shown in FIG. 1(*b*), thereby forming a trench 4. After removing away the resist 3, a conductive film 5 is formed covering the trench 4 as shown in FIG. 1(*c*). Then, the conductive film 5 in areas other than the trench 4 is removed in a polishing process using, for example, a Chemical Mechanical Polish process (hereinafter referred to as "CMP process"), as shown in FIG. 1(*d*).

Figure 2:
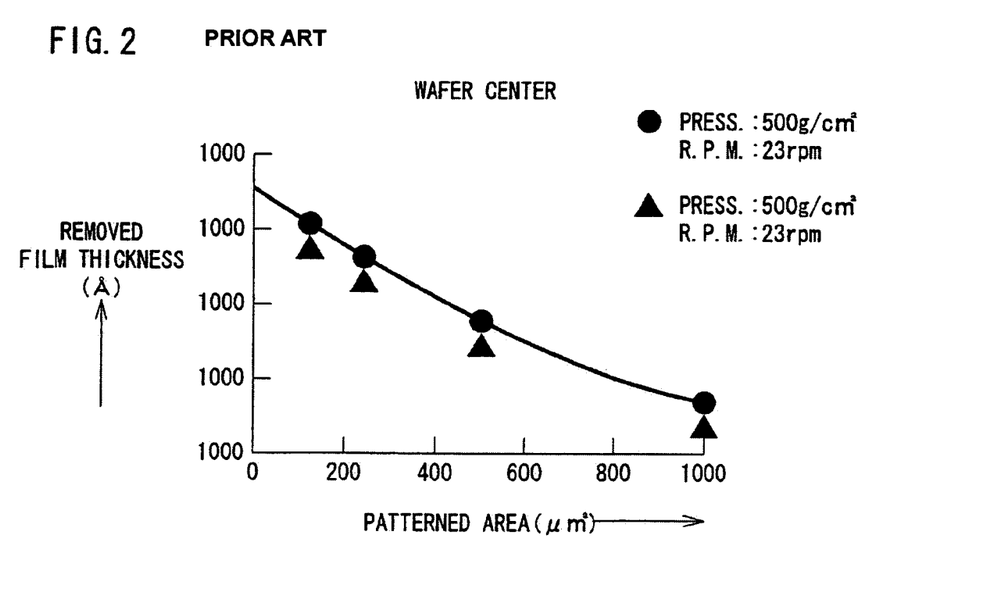
FIG. 2 is a graph showing a usual polish characteristic in CMP.

It is known that, where the conductive film 5 is removed by the CMP process, as the opening area of the trench increases the polish rate on the conductive film buried in the trench incraeses, as shown in FIG 2. In regions having a small trench opening area, such as is customary in interconnections, there are no particular problems. However, in regions having a large trench opening area, such as a bonding pad shown in FIG. 3, the conductive film 5 in the trench is polished into a dish-like form by an abrasive as shown in FIG. 4, thus resulting in so-called dishing. Due to this, there are cases a disconnect or an increase of resistance occurs in a central portion A where the wall thickness is reduced when providing connection between the bonding pad and the IC frame.

SUMMARY OF THE INVENTION

Therefore, it is a primary object of the present invention to provide a novel damascene interconnection and semiconductor device.

Another object of the invention is to provide a damascene interconnection capable of preventing increases in resistance value or disconnects caused by dishing in a bonding pad, and a semiconductor device using the same.

A damascene interconnection according to the present invention, comprises: an interconnection trench formed in an insulating film and a pad trench communicating therewith; a protrusion formed by a portion not removed of the insulating film in the pad trench to decrease a substantial opening area of the pad trench; and a conductive film buried in the interconnection trench and the pad trench.

In the case of using such a damascene interconnection for a semiconductor device, such a semiconductor device, comprises: a semiconductor substrate; an insulating film formed on the semiconductor substrate; an interconnection trench formed on the insulating film and communicating with a semiconductor element; a pad trench formed on the insulating film and communicating with the interconnection trench; a protrusion formed by a portion of not removed of the insulating film in the pad trench and reducing a substantial opening area of the pad trench; and a conductive film buried in the interconnection trench and the pad trench.

When removing the conductive film by a CMP process or the like, the protrusion dividing the pad trench serves as a stop for polishing by an abrasive. Consequently, so-called dishing will not occur such that the conductive film in the pad trench is excessively removed. Thus, according to the invention, it is possible to prevent increases in resistance or disconnects resulting from dishing on a bonding pad.

The protrusion may be formed not to divide the conductive film buried in the pad trench, or formed to divide the conductive film. However, where the conductive film is divided, another means is required to electrically couple together divided conductive film portions. The other means may be a contact hole for connecting between the conductive film formed in the insulating film and a conductive film arranged in a level lower than the insulating film. It should be noted that the contact hole is effective also where the conductive film in the pad trench is not divided by a protrusion.

The protrusion includes, in one embodiment, island protrusions distributed in a proper interval in the pad trench, and in another embodiment ridges.

The above described objects and other objects, features, aspects and advantages of the present invention will become more apparent from the following detailed description of the present invention when taken in conjunction with the accompanying drawings.

BEST FORM FOR PRACTICING THE INVENTION

Figure 5:
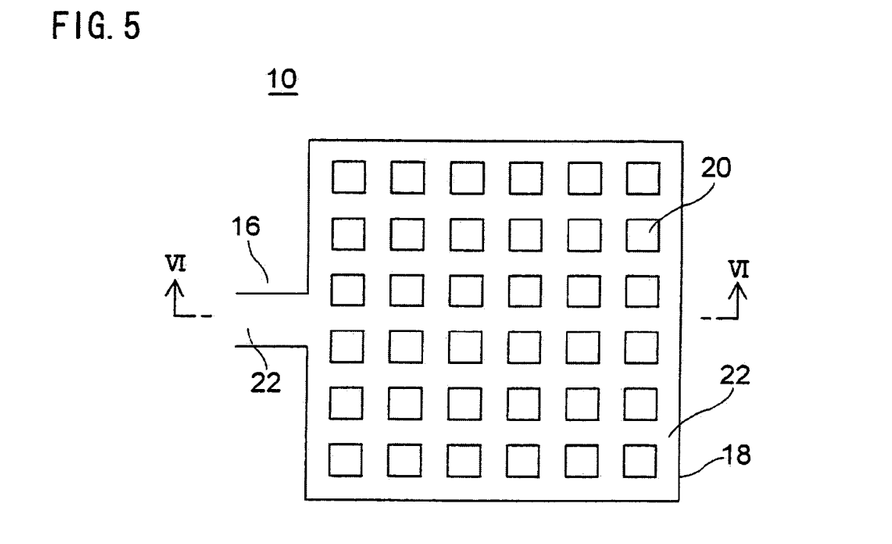
FIG. 5 is an illustrative view showing one embodiment of the present invention.
Figure 6:
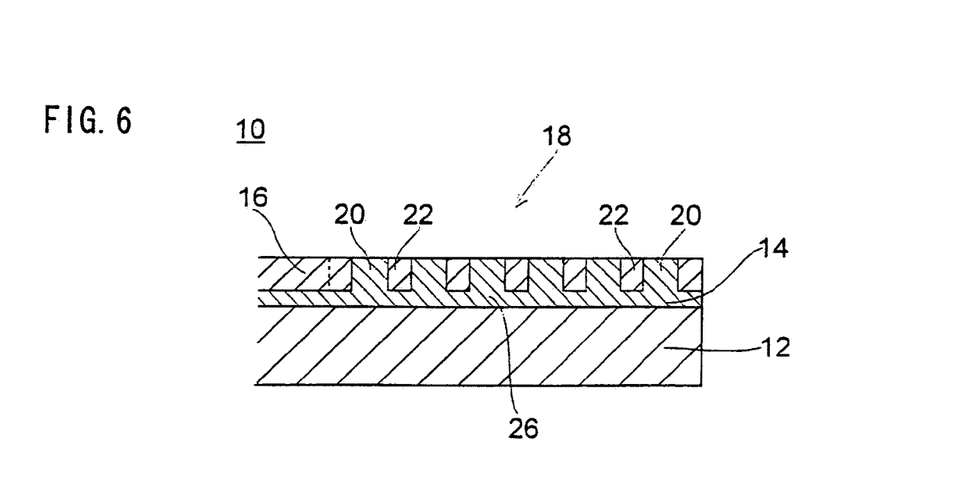
FIG. 6 is a sectional view taken along line VI—VI in FIG. 5.

A semiconductor device 10 of the embodiment shown in FIG. 5 and FIG. 6 includes a semiconductor substrate 12 formed, for example, of silicon (Si) or the like. Note that the semiconductor substrate 12 may be other materials. Semiconductor elements, including active and/or passive elements, are formed on the semiconductor substrate 12, although they are not shown in the figure.

The semiconductor device 10 comprises a damascene interconnection 11 including, on the semiconductor substrate 12, an interconnection trench 16 extending from the semiconductor element (not shown) and a pad trench 18 connected to the interconnection trench 16. That is, an insulating film 14 is formed, for example, of silicon oxide ($SiO_2$) in a uniform film thickness on the semiconductor substrate. In the insulating film 14, the interconnection trench 16 and the pad trench 18 connected therewith are formed. The insulating film 14 may be other materials.

Note that FIG. 5 and FIG. 6 illustrate the insulating film 14 formed directly on the surface of the semiconductor substrate 12 in order simplify illustration and explanation. However, in the actual semiconductor device, one or a plurality of semiconductor element layers are formed on the semiconductor substrate 12, as is well known in the arts, and an interconnection layer is formed as required on each of such semiconductor element layers. The interconnection trench 16 provides electrical connection between the semiconductor element (not shown) and the pad trench 18. The pad trench 18 serves as a bonding pad on which wire-bonding is to be made to a not-shown IC leadframe. That is, the pad trench 18 is a connection terminal to provide electric conduction of the semiconductor element on each layer to and from the IC leadframe.

It has been a conventional practice to form such a damascene interconnection 11 by merely filling a conductive film, such as of copper (Cu), aluminum (Al) or tungsten (W), in the interconnection trench 16 and pad trench 18.

In this embodiment, however, the following devise is implemented on the pad trench 18 with a comparatively large opening area, in order to prevent dishing as stated before. That is, the pad trench 18 has an insulating film 14 formed to be left as an island-spotted form. Consequently, the pad trench 18 is divided into unitary portions by island protrusions 20. However, the island protrusions 20 do not separate one portion from another portion of the pad trench 18, i.e. the pad trench 18 is continuous in areas except for the island protrusions 20. That is, the pad trench 18 in this embodiment has a large opening size but is reduced in its substantial opening area by the presence of the island protrusions 20. Specifically, in this embodiment the pad trench 18 has a side determined as approximately 50–200μm and an interval of the protrusions 20 determined as approximately 5–20μm.

In the pad trench 18 thus having the island-spotted protrusions 20, a conductive film 22 is formed using a metal as mentioned before or conductive material in a manner similar to that of the interconnection trench 16. Thus, the semiconductor element (not shown) on the semiconductor device 10 is electrically coupled through the conductive film 22 buried in the interconnection trench 16 to the pad trench 18, i.e. the conductive film 22 buried in the pad trench 18. Due to this, by bonding a wire (not shown) to the conductive film 22 formed in the pad trench 18, the semiconductor element is put in electrical connection to the wire, i.e. to the IC leadframe.

Hereunder, explanation is made on a method to concretely manufacture a semiconductor device 10 of the embodiment having a damascene interconnection 11 as described above, with reference to FIG. 7. Incidentally, in FIG. 7 an insulating film 14 is formed directly on a surface of a semiconductor substrate 12. It should however be noted that the semiconductor device 10, in practice, has a proper number of semiconductor element layers as stated before and FIG. 7 depicts an interconnection structure having only one layer for the sake of convenience.

Figure 7:
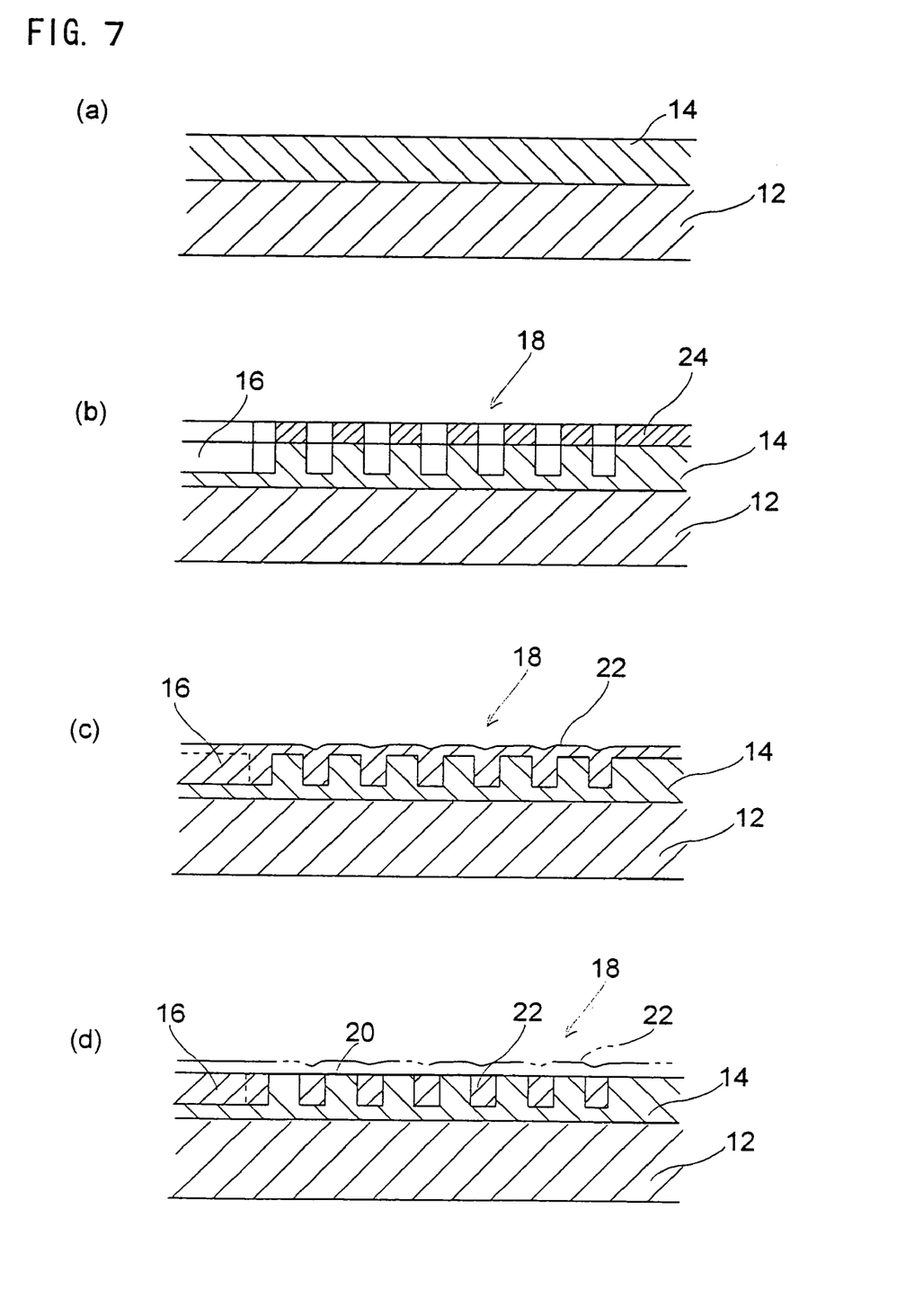
FIG. 7 is an illustrative view showing a method for forming the FIG. 5 embodiment.

An insulating layer 14 is formed on a semiconductor substrate 12 by thermal oxidation process or the like, as shown in FIG. 7(a). Thereafter, the insulating film 14 is masked with patterned resist 24 to leave island protrusions 20. Etching is made to form an interconnection trench 16 and a pad trench 18. At this time, a plurality of island protrusions 20 are formed in the pad trench 18. After removing the resist 24, a conductive film 22 is formed over an entire surface of the semiconductor substrate 12 including the interconnection trench 16 and pad trench 18 by a CVD or hot sputter process, as shown in FIG. 7(c). Then, the conductive film 22 on the insulating film 14 is removed as shown in FIG. 7(d) by a CMP process.

In the CMP process, the semiconductor substrate 12 (including the insulating film 14 and the conductive film 22) is urged onto a polishing pad mounted on a polisher table. The table and the substrate holder are relatively rotated while supplying to the polishing pad a slurry containing abrasive particles. When the conductive film 22 on the insulating film 14 is removed, the polishing operation is finished. In this case, the abrasive particle for polishing is selected of a kind (material, particle size, etc.) such that in CMP a polish rate on the insulating film 14 is lower than a polish rate on the conductive film 22. According to an experiment conducted by the present inventors, the polish rate in concrete is desirably given as (polish rate on the conductive film 22)/(polish rate on the insulating film 14)$\geq$20 to 10. This is because in CMP the conductive film 22 on the insulating film 14 needs to be removed as rapidly as possible. However, the insulating film 14 should be prevented from being damaged due to polishing, and the island projections 20 are to prevent over-polishing the conductive film 22 of the pad trench 18. Consequently, there is a necessity of providing the insulating film 14 with greater polish resistance than that of the conductive film 22.

According to this embodiment, in the process of removing the conductive film 22 (FIG. 7(d)), the protrusions 20 (insulating film 14) having a low polish rate act such that the conductive film 22 is decelerated during the process of polishing by the polish pad. Thus, the conductive film 22 in the pad trench 18 can be prevented from being removed to an excessive extent. This in turn makes it possible to prevent the pad trench 18 from increasing in resistance or the occurrence of disconnects due to dishing.

Figure 3:
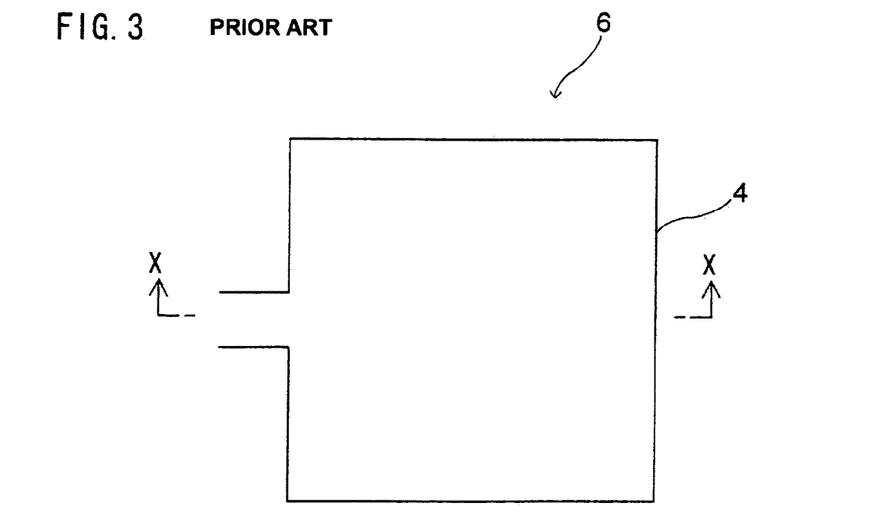
FIG. 3 is an illustrative view showing a prior art bonding pad.
Figure 4:
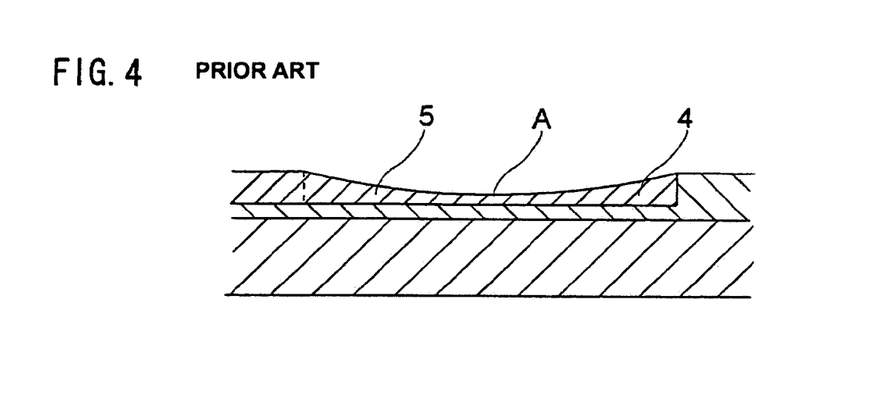
FIG. 4 is a sectional view taken along line X—X in FIG. 3.

That is, in the conventional art shown in FIG. 3 and FIG. 4, because the pad trench 6 is contacted in its entire opening by a polish pad (not shown), the pad trench 6 having a large opening area is partly over-polished resulting in dishing. On the contrary, in this embodiment, despite the pad trench is large in opening area, the opening is divided into unitary portions wherein the opening area is small if considered on a portion sandwiched between the island protrusions 20. Due to this, over-polish will not occur. As a result, a conductive film 22 in the pad trench 18 is given a planar surface as shown in FIG. 6 and FIG. 7(*d*).

In this manner, in the present invention, where using a CMP method having a polish characteristic that the polish rate increases with an increase in the opening area, the forming of protrusions in the pad trench reduces the substantial opening area, thereby preventing dishing.

Incidentally, the protrusions 20 may be in a form to divide the pad trench 18 into portions. The shape of a protrusion may be a straight line as shown in FIG. 8 or a squared-spiral form as shown in FIG. 9.

Figure 8:
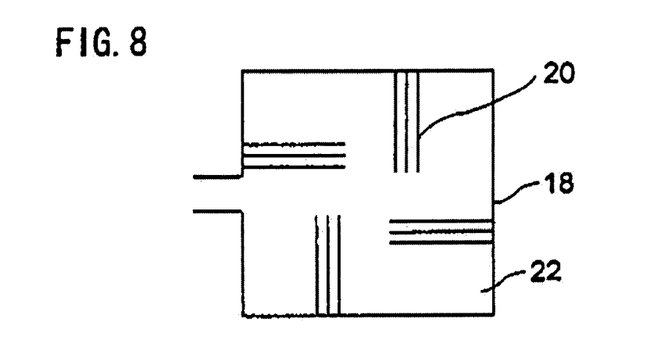
FIG. 8 is an illustrative view showing another embodiment of the invention.

That is, in the embodiment shown in FIG. 8, a plurality of protrusions or ridges 20 are formed extending from respective outer edges of four sides of a rectangular pad trench 18. It should be noted that, in also this case, the other areas of the pad trench 18 are continuous with one another. In also this embodiment, the substantial opening area is reduced in the areas between the protruding ridges 20, between protruding ridges extending from different sides, and between the protruding ridge 20 and the inner edge of the pad trench 18.

Figure 9:
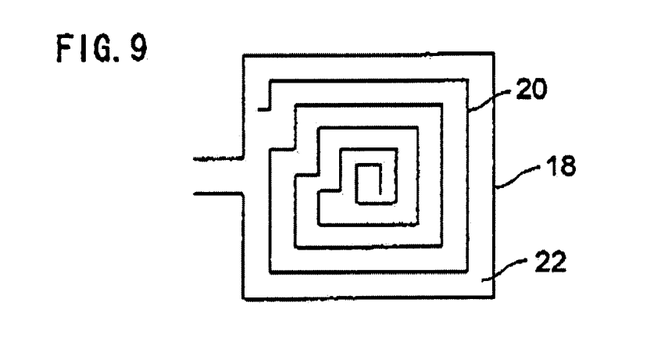
FIG. 9 is an illustrative view showing another embodiment of the invention.

In the embodiment of FIG. 9, a pad trench 18 has one ridge 20 formed in a squared-spiral form. In the FIG. 9 embodiment, because the ridge 20 is in the spiral form, the pad trench 18 is not divided into non-continuous areas. In this manner, by forming the ridge 20 in the spiral form, the opening area is substantially reduced in the areas between portions of the ridge 20 and between the ridge 20 and the pad trench 18 inner edge.

Meanwhile, if necessary, connection holes or contact holes 26 may be formed through a bottom of the pad trench 18 to provide electrical connection between the conductive film 22 and a not-shown lower-level conductive film through these contact holes 26.

Figure 10:
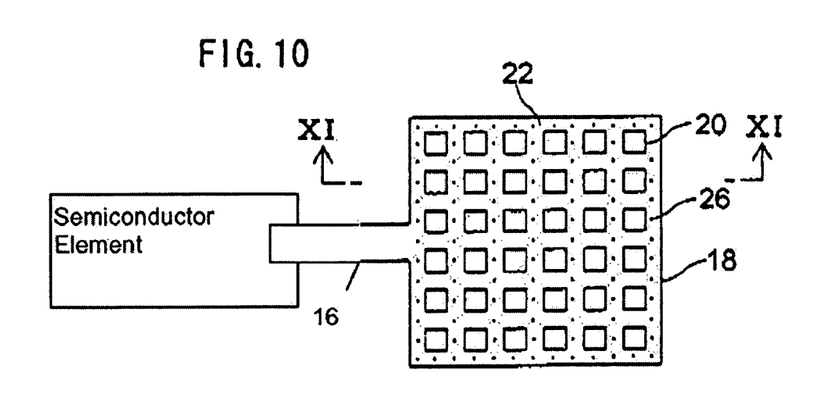
FIG. 10 is an illustrative view showing another embodiment of the invention.
Figure 11:
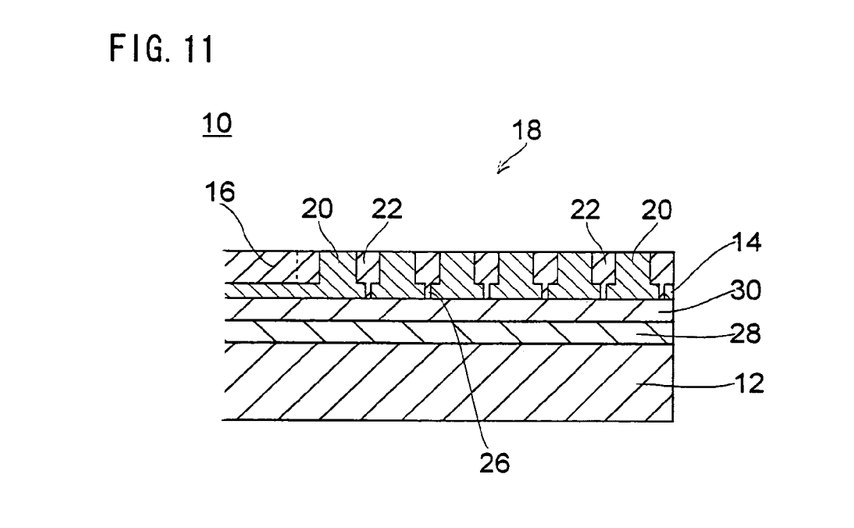
FIG. 11 is a sectional view on line XI—XI in FIG. 10.

Explanation is made in detail on an embodiment having contact holes 26 formed through the insulating film 14, with reference to FIG. 10 and FIG. 11. This embodiment is to be applied to a semiconductor device having another layer formed in a level lower than the insulating film 14, as shown in FIG. 11. That is, another insulating film 28 is formed on a semiconductor substrate 12, and further another conductive film 30 is formed on the insulating film 28. The insulating film 14 is formed on the conductive film 30. In a bottom of the pad trench 18, a plurality of contact holes 26 are formed penetrating through the insulating film 14. When forming a metal or conductive film 22 in the pad trench 18, a metal or conductive material thereof is also filled in the contact holes 26 to provide electrical connection between the upper-leveled conductive film 22 and lower-leveled conductive film 30. By thus forming the contact holes 26 in the pad trench 18 and connecting the conductive films 22 and 30, it is possible to eliminate the disadvantage as feared upon forming protrusions 20 in the pad trench 18.

That is, the protrusions or ridges if formed in the pad trench 18, result in a volume decrease of the pad trench 18, i.e. volume reduction of the conductive film 22 of the pad trench 18. It is to be feared that the bonding pad may be increased in electric resistance by the volume reduction in the conductive film 22 of the pad trench 18. However, the conductive film 22, if coupled to the conductive film 30 as in the FIG. 10 and FIG. 11 embodiments, increases the effective volume of the conductive film 22, thus properly suppressing the electric resistance from increasing.

Figure 12:
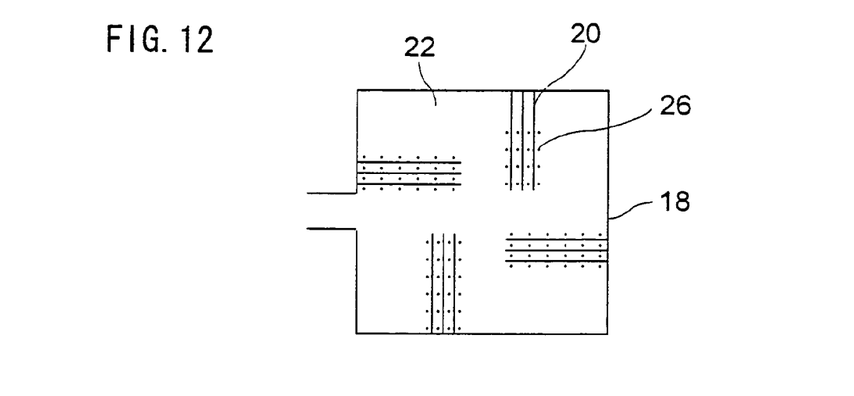
FIG. 12 is an illustrative view showing another embodiment of the invention.

In an embodiment shown in FIG. 12, contact holes 26 are added to the structure of the FIG. 8 embodiment to thereby make the conductive film 22 of the pad trench 18 integral with a lower-leveled conductive film.

Figure 13:
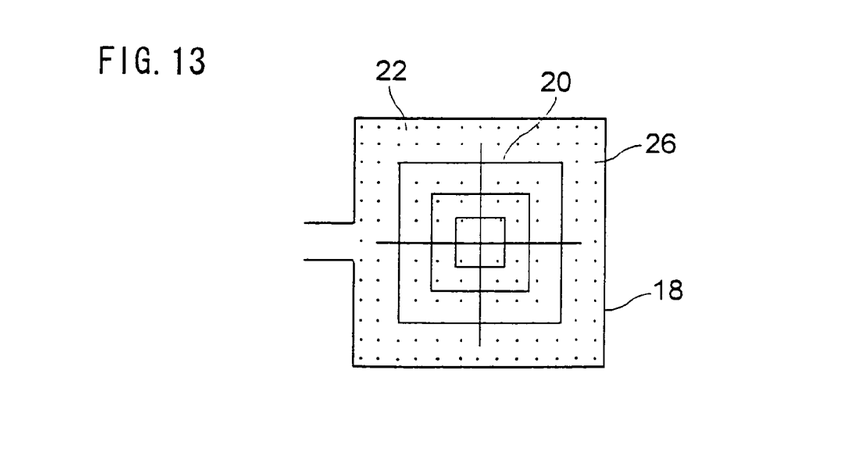
FIG. 13 is an illustrative view showing another embodiment of the invention.

In an embodiment of FIG. 13, a ridge 20 is formed in a closed-loop form in a manner different from the FIG. 9 embodiment. Accordingly, in this embodiment, the conductive film 22 of the pad trench 18 is divided into portions, in a manner different from the above embodiment. In this case, the contact holes 26 are especially effective. That is, the formation of contact holes 26 connects the conductive film 22 of the pad trench 18 to a lower-leveled conductive film 30 (FIG. 11). Consequently, the divided portions of the conductive film 22 of the pad trench 18 are electrically coupled together through the conductive film 30. That is, in the FIG. 13 embodiment, the ridge or protrusion 20 is formed in a closed-loop form. However, no problem is encounterd with disconnects in the pad trench 18 due to the protrusion or ridge 20 because the conductive film 22 is coupled to the lower-leveled conductive film through the via holes 26.

Incidentally, in the present invention, the protrusion or ridge for reducing the actual opening area of the pad trench may be provided in plurality in the pad trench or employed one in number.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bonding pad, comprising:
    a pad trench formed in an insulating film and connected to an interconnection trench formed along a surface of said insulating film
    a protrusion formed by a portion not removed of said insulating film in said pad trench to decrease a substantial opening area of said pad trench;
    a conductive film buried in said pad trench to form a bonding pad and connected to a semiconductor element through said interconnection trench; and
    a contact hole formed within said pad trench at a position near said protrusion to electrically connect said conductive film to a further conductive film formed below said insulating film within said pad trench, wherein said contact hole and said further conductive film substantially suppress an increase in electrical resistance in said pad trench due to formation of said protrusion.

2. A bonding pad according to claim 1, wherein said protrusion is formed not to divide said conductive film buried in said pad trench.

3. A bonding pad according to claim 2, wherein said protrusion includes a plurality of island protrusions distributed at a proper interval in said pad trench.

4. A bonding pad according to claim 2, wherein said protrusion includes a ridge.

5. A bonding pad according to claim 1, wherein said protrusion is formed to divide said conductive film into divided portions.

6. A bonding pad according to claim 5, wherein said protrusion includes a closed-loop ridge encompassing one part of said conductive film in said pad trench.

7. A bonding pad according to claim 6, wherein each of said divided portions is electrically connected to said further conductive film through said contact hole.

8. A bonding pad according to claim 5, wherein each of said divided portions is electrically connected to said further conductive film through said contact hole.

9. A bonding pad according to claim 1, wherein said contact hole is located to surround said protrusion.

10. A semiconductor device having a bonding pad, comprising:
- a semiconductor substrate;
- an insulating film formed on said semiconductor substrate;
- an interconnection trench formed on said insulating film and formed along a surface of said insulating film;
- a pad trench formed on said insulating film and connected to said interconnection trench;
- a protrusion formed by a portion not removed of said insulating film in said pad trench and reducing a substantial opening area of said pad trench;
- a conductive film buried in said interconnection trench and said pad trench;
- a semiconductor element electrically connected to said conductive film buried in said interconnection trench;
- said bonding pad being formed by said conductive film buried in the pad trench;
- a further conductive film formed below said insulating film within said pad trench; and
- a contact hole formed within said pad trench at least at a position near said protrusion to electrically connect said conductive film to said further conductive film, wherein said contact hole and said further conductive film substantially suppress an increase in electrical resistance in said pad trench due to formation of said protrusion.

11. A semiconductor device having a bonding pad according to claim 10, wherein said protrusion is formed not to divide said conductive film buried in said pad trench.

12. A semiconductor device having a bonding pad according to claim 11, wherein said protrusion includes a plurality of island protrusions distributed at a proper interval in said pad trench.

13. A semiconductor device having a bonding pad according to claim 11, wherein said protrusion includes a ridge.

14. A semiconductor device having a bonding pad according to claim 10, wherein said protrusion is formed to divide said conductive film into divided portions.

15. A semiconductor device having a bonding pad according to claim 14, wherein said protrusion includes a closed-loop ridge encompassing one portion of said conductive film in said pad trench.

16. A semiconductor device having a bonding pad according to claim 15, wherein each of said divided portions is electrically connected to said further conductive film through said contact hole.

17. A semiconductor device having a bonding pad according to claim 14, wherein each of said divided portions is electrically connected to said further conductive film through said contact hole.

18. A semiconductor device having a bonding pad according to claim 10, wherein said contact hole is located to surround said protrusion.

* * * * *